US011233959B2

(12) United States Patent
Sekine

(10) Patent No.: US 11,233,959 B2
(45) Date of Patent: Jan. 25, 2022

(54) IMAGE SENSOR

(71) Applicant: TIANMA JAPAN, LTD., Kanagawa (JP)

(72) Inventor: Hiroyuki Sekine, Kanagawa (JP)

(73) Assignee: TIANMA JAPAN, LTD., Kanagawa (JP)

(*) Notice: Subject to any disclaimer, the term of this patent is extended or adjusted under 35 U.S.C. 154(b) by 0 days.

(21) Appl. No.: 17/197,474

(22) Filed: Mar. 10, 2021

(65) Prior Publication Data

US 2021/0289155 A1    Sep. 16, 2021

(30) Foreign Application Priority Data

Mar. 11, 2020  (JP) .............................. JP2020-041484

(51) Int. Cl.
| H04N 5/365 | (2011.01) |
| H04N 5/3745 | (2011.01) |
| H01L 27/146 | (2006.01) |
| H04N 5/374 | (2011.01) |
| H04N 5/369 | (2011.01) |

(52) U.S. Cl.
CPC ..... *H04N 5/3651* (2013.01); *H01L 27/14612* (2013.01); *H01L 27/14636* (2013.01); *H04N 5/3698* (2013.01); *H04N 5/3741* (2013.01); *H04N 5/37457* (2013.01)

(58) Field of Classification Search
CPC ............. H04N 5/3651; H04N 5/37457; H04N 5/3741; H04N 5/3698; H01L 27/14636; H01L 27/14612
See application file for complete search history.

(56) References Cited

U.S. PATENT DOCUMENTS

| 5,296,696 A | 3/1994 | Uno | |
| 2012/0105695 A1* | 5/2012 | Iida | H04N 5/243 348/301 |
| 2013/0032691 A1* | 2/2013 | Cho | H04N 5/3575 250/206 |
| 2015/0208008 A1* | 7/2015 | Gendai | H04N 5/3698 250/208.1 |
| 2016/0027827 A1 | 1/2016 | Sekine | |
| 2018/0063450 A1* | 3/2018 | Murao | H04N 5/3745 |

FOREIGN PATENT DOCUMENTS

| JP | H5-207220 | 8/1993 |
| JP | 2016-25572 | 2/2016 |

* cited by examiner

*Primary Examiner* — Shahbaz Nazrul

(74) *Attorney, Agent, or Firm* — Nixon & Vanderhye

(57) ABSTRACT

An image sensor includes a pixel and a control circuit to detect the optical signal transmitted by a signal line. The pixel includes a photodetector, an amplifier circuit configured to amplify an optical signal from the photodetector, and a first switch configured to control whether to output the optical signal from the pixel to the signal line. The control circuit includes a first capacitor connected with the signal line and an integrator connected with the signal line via the first capacitor. The control circuit is configured to successively supply a first potential and a second potential different from each other to the signal line in a state where the first switch is non-conductive, and measure an amplification rate determined by the first capacitor and the integrator based on outputs of the integrator when the first potential is supplied and the second potential is supplied.

9 Claims, 12 Drawing Sheets

IMAGE SENSOR

CROSS-REFERENCE TO RELATED APPLICATIONS

This non-provisional application claims priority under 35 U.S.C. § 119(a) on Patent Application No. 2020-41484 filed in Japan on Mar. 11, 2020, the entire content of which is hereby incorporated by reference.

BACKGROUND

This disclosure relates to an image sensor, and particularly to a technique to improve the noise characteristic of the image sensor.

Flat panel detectors (FPDs) for X-ray fluoroscopy have been improved to have higher resolution. The pixel area reduced by this improvement results in reduction of the amount of signal, which lowers the signal-to-noise ratio (SNR) in conventional FPDs employing a passive pixel sensor (PPS) method. One of the solutions to this problem is an active pixel sensor (APS) method that utilizes an amplifier circuit provided in each pixel. Complementary metal oxide semiconductor (CMOS) sensors fabricated on a crystalline silicon substrate employ this APS method.

However, for FPDs to be manufactured by disposing thin-film transistors (TFTs) on a large glass substrate, the amplifier circuits also have to be made of TFTs. This causes the following problem. The TFTs as amplifier circuits vary in threshold voltage depending on their positions on the glass substrate and as a result, the amplifier circuits have offset errors. An offset error leads to a fixed-pattern noise (FPN). An attempt to correct the FPN with a signal detector circuit or in image processing reduces the dynamic range of the signal depending on the magnitude of the offset error.

A technique to reduce the offset errors caused by the variation in threshold voltage among TFTs or other types of transistors is disclosed in JP H05-207220 A. JP H05-207220 A discloses a circuit diagram including an FPN suppression circuit and a pixel in FIG. 1 and a timing chart illustrating their operation in FIG. 2.

The FPN suppression circuit disclosed therein includes an inverting amplifier having a high gain and a feedback capacitor C2 and the FPN suppression circuit is connected with a vertical signal line VL to output the voltage of a pixel via a capacitor C1. According to JP H05-207220 A, the differential voltage between the pixel voltage after the pixel is irradiated with light and the pixel voltage after the pixel voltage is reset is amplified $-C1/C2$ times and therefore, the offset error is eliminated from the signal by reading this differential voltage.

SUMMARY

An image sensor according to an aspect of this disclosure includes: a pixel; a signal line configured to transmit an optical signal of the pixel; and a control circuit configured to control the pixel to detect the optical signal transmitted by the signal line. The pixel includes: a photodetector; an amplifier circuit configured to amplify an optical signal from the photodetector; and a first switch configured to control whether to output the optical signal from the pixel to the signal line. The control circuit includes: a first capacitor connected with the signal line; an integrator connected with the signal line via the first capacitor in order to detect the optical signal. The control circuit is configured to: successively supply a first potential and a second potential different from each other to the signal line in a state where the first switch is non-conductive; and measure an amplification rate determined by the first capacitor and the integrator based on outputs of the integrator when the first potential is supplied and the second potential is supplied.

An aspect of this disclosure is a method of controlling an image sensor. The image sensor includes a pixel, a signal line configured to transmit an optical signal of the pixel, a first capacitor connected with the signal line, and an integrator connected with the signal line via the first capacitor in order to detect the optical signal. The pixel includes a photodetector, an amplifier circuit configured to amplify an optical signal from the photodetector, and a first switch configured to control whether to output the optical signal from the pixel to the signal line. The method includes: successively supplying a first potential and a second potential different from each other to the signal line in a state where the first switch is non-conductive; and measuring an amplification rate determined by the first capacitor and the integrator based on outputs of the integrator when the first potential is supplied and the second potential is supplied.

It is to be understood that both the foregoing general description and the following detailed description are exemplary and explanatory and are not restrictive of this disclosure.

EMBODIMENTS

Figure 1:
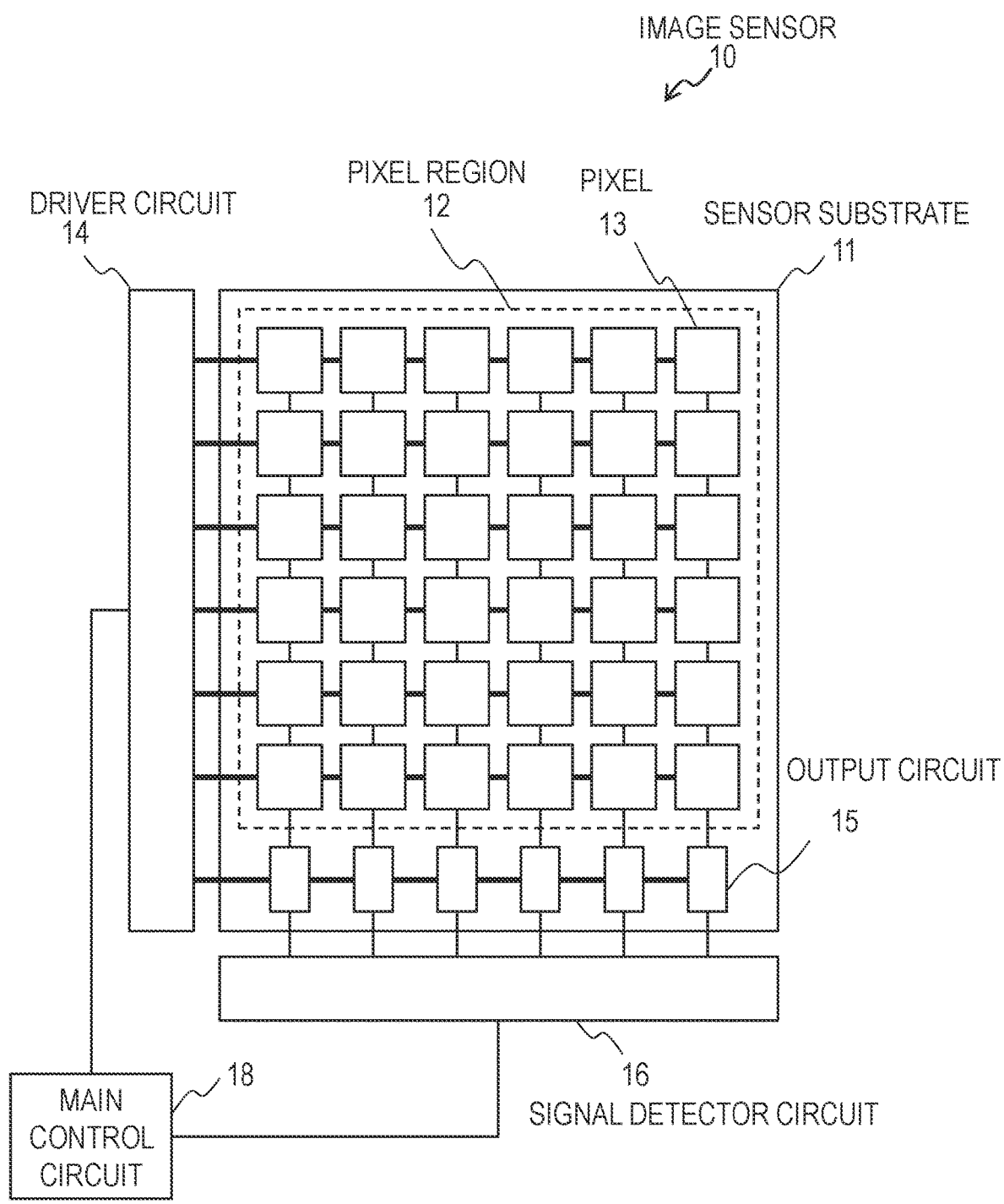
FIG. 1 is a block diagram illustrating a configuration of an image sensor in an embodiment.

Hereinafter, the image sensor of this disclosure is described in detail with reference to the accompanying drawings. The elements in each drawing are changed in size or scale as appropriate to be recognized in the drawing. The hatches in the drawings are to distinguish the elements and are not to represent cross-sections. The non-linear elements used as switching elements or amplifying elements are referred to as transistors and the transistors include thin-film transistors (TFTs).

The image sensor of this disclosure is applicable to radiographic imaging devices in the fields of medical and industrial non-destructive testing. The image sensor disclosed herein includes pixels each including an amplifier circuit and integrators each connected with a signal line via a capacitor Cdet (first capacitor) to detect optical signals of the pixels. The light to be detected is electromagnetic rays having a specific frequency, which can be infrared rays, visible light, or X-rays. The capacitor Cdet is to convert the variation in potential of the signal line into charge. The integrator is an element of a charge detection type of signal detector circuit and includes a feedback capacitor Cf.

This configuration enables detection of the absolute value of a variation in the potential of a signal line amplified with a gain of Cdet/Cf, reducing the offset error caused by the variation in threshold among the transistors (for example, TFTs) in the amplifier circuits in the pixels.

In an example, the capacitors Cdet for converting the variation in the potential of a signal line into charge can be fabricated on the insulating substrate (glass substrate) of the image sensor, together with the pixels and the signal lines. Accordingly, a charge detection type of signal detector circuit (integrated circuit) developed for the conventional passive pixel sensor (PPS) type of flat panel detectors (FPDs) can be used.

The gain in the above-described configuration is determined by the ratio of the capacitance of the capacitor Cdet on the glass substrate to the capacitance of the feedback capacitor Cf in the signal detector circuit. The image sensor disclosed herein supplies different constant potentials to a signal line to measure the gain based on the capacitance ratio in accordance with the outputs of the integrator in response to those potentials. As a result of this operation, the image sensor acquires the optical signal detection gains for individual signal lines (pixel columns) more accurately. The image sensor corrects the outputs of the individual integrators depending on the measured gains to uniformize the gains of the signals detected by the signal detector circuit among the signal lines.

The image sensor disclosed herein can further be configured to supply each signal line with a potential that changes the polarity of the voltage between the control terminal (for example, the gate terminal) of a transistor in the amplifier circuit and the signal line (for example, the source of the transistor), after reading an optical signal from a pixel. This operation reduces variation in characteristics of the transistor in the amplifier circuit. This is because a voltage of the same polarity keeps being applied across the control terminal of the transistor of the amplifier circuit and the signal line for a long time in order to amplify the signal from a photodetector and therefore, the characteristics of the transistor used for amplification change more easily than the characteristics of a transistor used as a switching element. The above-described configuration reduces the change in characteristics of the transistor.

Embodiment 1

FIG. 1 is a block diagram illustrating a configuration example of an image sensor related to Embodiment 1. The image sensor 10 of this disclosure includes a sensor substrate 11 and control circuits. The control circuits include output circuits 15, a driver circuit 14, a signal detector circuit 16, and a main control circuit 18.

The sensor substrate 11 includes an insulative substrate (such as a glass substrate) and a pixel region 12 in which pixels 13 are aligned horizontally and vertically like a matrix on the insulative substrate. The output circuits 15 are fabricated directly on the insulative substrate of the sensor substrate 11; each output circuit 15 is provided for one pixel column consisting of pixels aligned vertically in FIG. 1. The pixel region 12 may include a scintillator that emits fluorescence in response to radial rays to be detected.

The driver circuit 14 drives the pixels 13 to detect light with the pixels 13. Each output circuit 15 receives an optical signal of a pixel transmitted by a signal line and outputs it to the signal detector circuit 16. The signal detector circuit 16 detects signals from individual signal lines. The main control circuit 18 controls the driver circuit 14 and the signal detector circuit 16.

The driver circuit 14, the signal detector circuit 16, and the main control circuit 18 in this embodiment are fabricated as components separate from the sensor substrate 11 and they are mounted on a silicon substrate, for example. These circuits can be included in different IC chips. Some or all of them can be included in the same IC chip. One circuit can be included in a plurality of IC chips.

Figure 2:
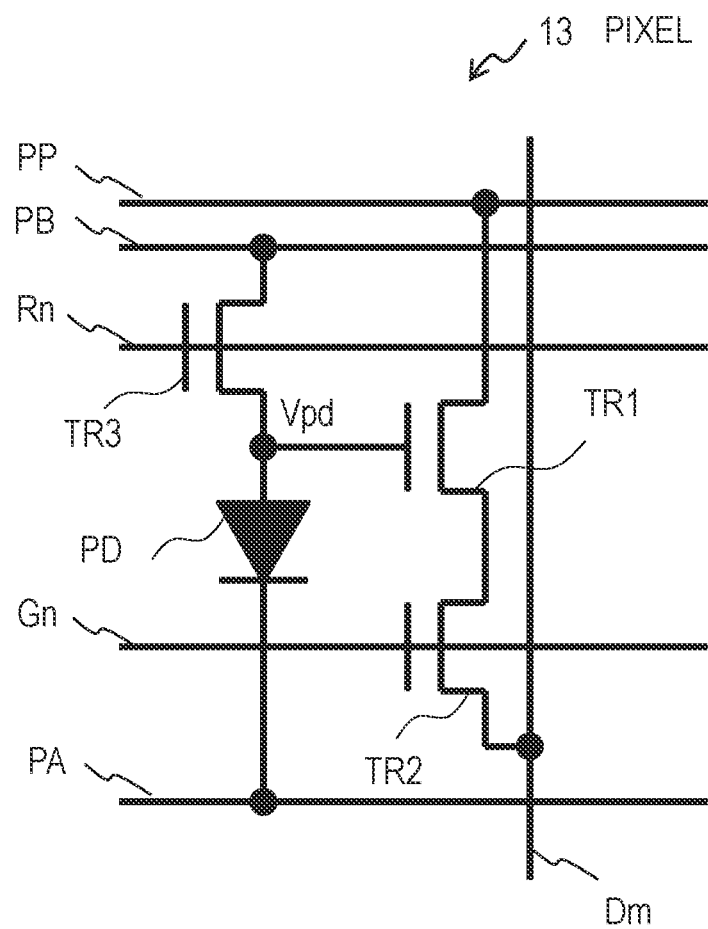
FIG. 2 is a circuit diagram illustrating a circuit configuration of a pixel in the image sensor in the embodiment.

FIG. 2 is a circuit diagram illustrating a circuit configuration of one pixel 13. One pixel 13 in the image sensor of this disclosure includes three transistors TR1, TR2, and TR3 and a photodiode PD. The photodiode PD is an example of a photodetector. In the example illustrated in FIG. 2, the anode terminal of the photodiode PD is connected with the gate terminal of the transistor TR1 and the drain terminal of the transistor TR3. The cathode terminal of the photodiode PD is connected with a power line PA. The drain terminal of the transistor TR1 is connected with a power line PP and the source terminal of the transistor TR1 is connected with the drain terminal of the transistor TR2.

The gate terminal of the transistor TR2 is connected with a control line Gn and the source terminal of the transistor TR2 is connected with a signal line Dm. The gate terminal of the transistor TR3 is connected with a control line Rn and the source terminal of the transistor TR3 is connected with a power line PB. The photodiode PD has a function to convert light to electric charge. The transistor TR1 (amplifier transistor) has a function to amplify the potential at one end of the photodiode PD. The transistor TR2 is a first switch of the pixel 13 and has a function to control the output. The transistor TR3 has a function to reset the potential of the photodiode PD.

Figure 3:
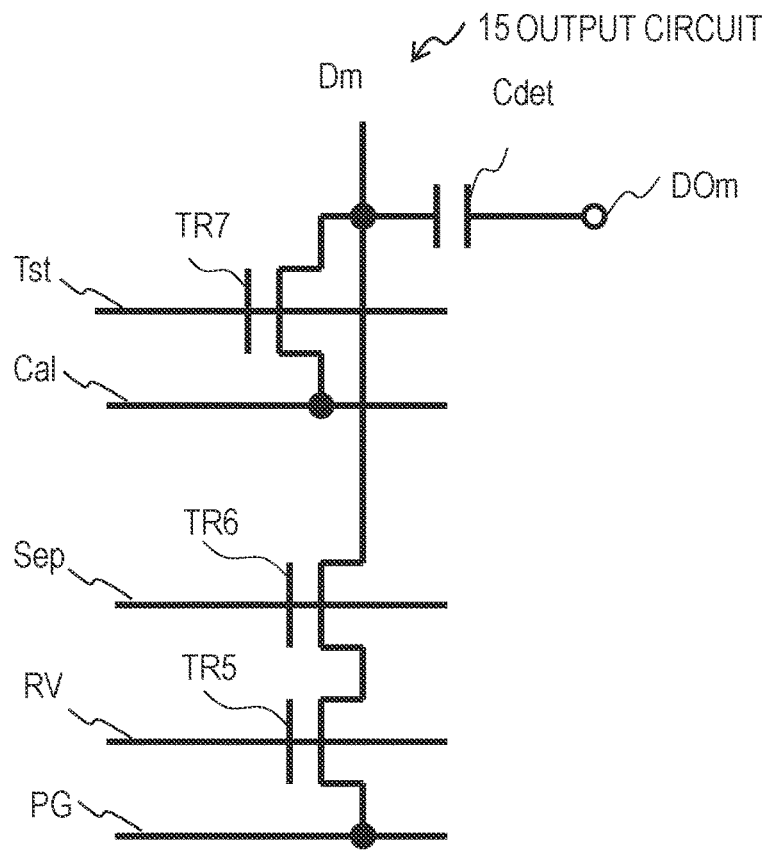
FIG. 3 is a circuit diagram illustrating a circuit configuration of an output circuit in the image sensor in the embodiment.

FIG. 3 is a circuit diagram illustrating a circuit configuration of an output circuit 15. Each pixel column is provided with one output circuit 15. The output circuit 15 includes three transistors TR5, TR6, and TR7 and a capacitor Cdet for voltage-to-charge conversion. The gate terminal of the transistor TR5 is connected with a control potential line RV; the drain terminal of the transistor TR5 is connected with the source terminal of the transistor TR6; and the source terminal of the transistor TR5 is connected with a power line PG.

The gate terminal of the transistor TR6 is connected with a control line Sep and the drain terminal of the transistor TR6 is connected with a signal line Dm. The gate terminal of the transistor TR7 is connected with a control line Tst; the drain terminal of the transistor TR7 is connected with the signal line Dm; and the source terminal of the transistor TR7 is connected with a power line Cal. The transistor TR7 is a switch circuit for controlling the conduction between the signal line Dm and the power supply circuit.

One terminal of the capacitor Cdet is connected with the signal line Dm and the other terminal of the capacitor Cdet is connected with the signal detector circuit 16. In this circuit configuration, the transistor TR5 functions as a constant current supply that makes the current flowing between the source and the drain constant using the potential of the control potential line RV. The output circuit 15 in FIG. 3 has an output terminal DOm.

Figure 4:
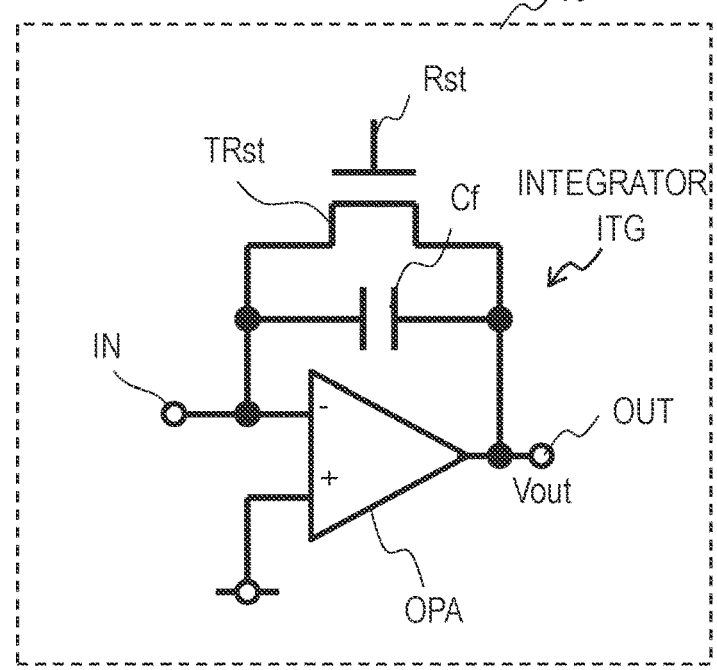
FIG. 4 is a circuit diagram illustrating constituent elements of a signal detector circuit applicable to the image sensor in the embodiment.

FIG. 4 is a circuit diagram of a part of the signal detector circuit 16 applicable to the image sensor of this disclosure. This circuit includes an operating amplifier circuit OPA, a feedback capacitor Cf, and a reset transistor TRst to function as an integrator. The reset transistor TRst is connected with a control line Rst.

When the reset transistor TRst becomes conductive, the charge of the feedback capacitor Cf is reset. In FIG. 4, the signal detector circuit 16 (integrator) has an input terminal IN and an output terminal OUT. The signal detector circuit 16 includes integrators each connected with a signal line Dm.

Although the detailed configuration of the driver circuit 14 is not shown in the drawings, the driver circuit 14 has functions to supply signals and potentials to the aforementioned control lines and power lines. The driver circuit 14 and the signal detector circuit 16 operate under the control of the main control circuit 18.

Figure 5:
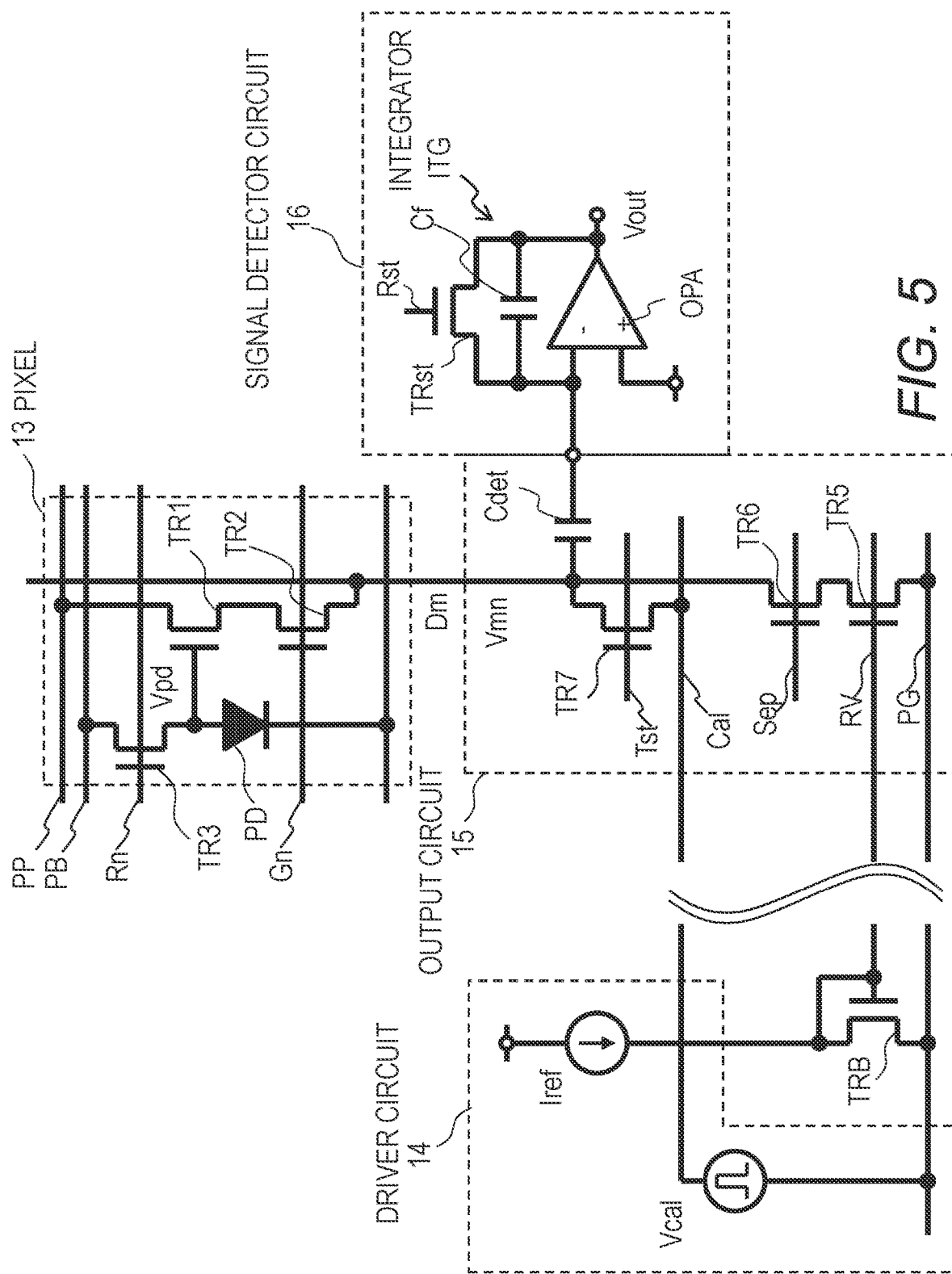
FIG. 5 is a circuit diagram illustrating a part of the connections among the components included in the image sensor in the embodiment.

FIG. 5 illustrates a part of the connections among the components included in the image sensor 10 of this disclosure. FIG. 5 illustrates only one pixel 13 in the pixel region 12 and only a part of the driver circuit 14 involved in controlling an output circuit 15. The driver circuit 14 includes a power supply circuit including a pulsed power supply. The image sensor 10 of this disclosure illustrated for Embodiment 1 has signal lines Dm each associated with one pixel column in which a plurality of pixels 13 are aligned vertically. The pixels 13 in the same pixel column are all connected with one signal line Dm.

A signal line Dm is connected with one output circuit 15 at an end of the sensor substrate 11. The transistor TRB in FIG. 5 is to determine the gate potential of the transistor TR5; its drain terminal and gate terminal are connected with the current source of the driver circuit 14 and its source terminal is connected with a power line PG. Accordingly, the potential of the gate terminal of the transistor TRB changes so that the drain-source current of the transistor TRB becomes equal to the current Iref from the current source.

If the electric characteristics of the transistor TRB and the transistor TR5 are equal, the transistor TRB and the transistor TR5 operate as a current mirror circuit. To equalize the drain-source current of the transistor TR5 to the current Iref of the current source, equalizing the electric characteristics of the transistor TRB and the transistor TR5 will work.

To achieve this configuration, the transistor TRB and the transistor TR5 are fabricated on the sensor substrate 11 by the same process and in the same size, for example. It is needless to say that the ratio of the current can be changed by changing the transistor sizes (the channel lengths L or the channel widths W) of the transistor TR5 and the transistor TRB. This embodiment is described assuming that the transistor sizes of the transistor TR5 and the transistor TRB are equal.

Figure 6:
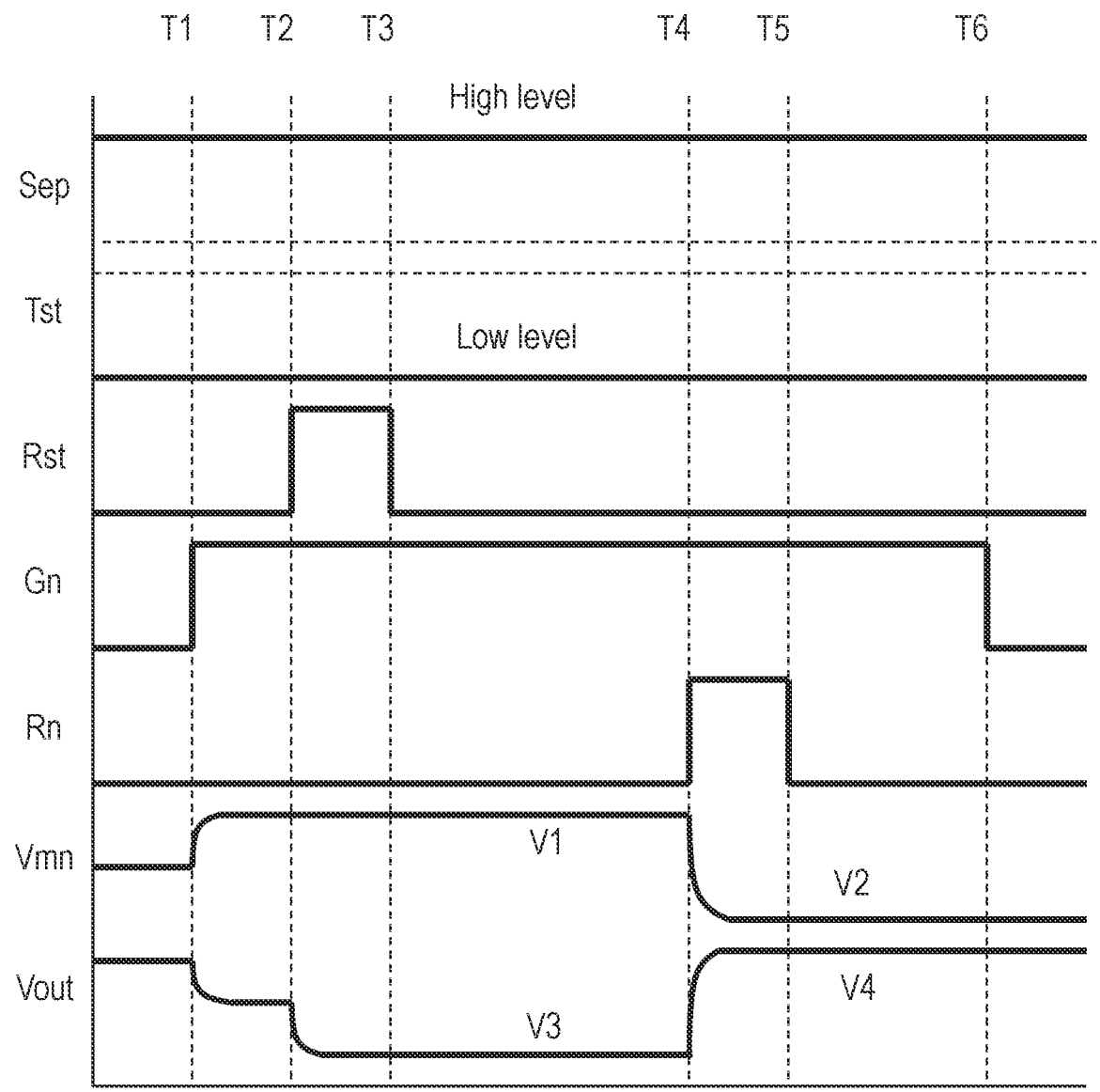
FIG. 6 is a timing chart illustrating the operation of the image sensor in the embodiment to read an optical signal.

FIG. 6 is a timing chart illustrating the operation of the image sensor 10 of this disclosure to read an optical signal. In reading an optical signal, the driver circuit 14 applies a high-level potential to the control line Sep and a low-level potential to the control line Tst. As a result, the transistor TR6 becomes conductive and the transistor TR7 becomes non-conductive.

To read signals from a given pixel row consisting of horizontally aligned pixels 13, the driver circuit 14 applies a high-level potential to the control line Gn at a time T1. As a result, the transistor TR2 of each pixel 13 becomes conductive. Then, current flows between the source and the drain of the transistor TR1 in accordance with the potential Vpd of the anode terminal of the photodiode PD. Since the transistor TR5 and the transistor TRB work as a current mirror circuit, the current flowing between the drain and the source of the transistor TR5 is equal to the current Iref from the current source in the driver circuit 14 and is constant.

Accordingly, the potential of the signal line Dm changes so that the drain-source current of the transistor TR1 becomes equal to the Iref. In other words, the transistor TR1 works as a source follower circuit with a load of the transistor TR5 that can be regarded as a current supply. If the transistors TR1 and TR5 have good saturation characteristics (the drain-source current is regarded as constant independently from the drain-source voltage), the transistor TR1 works as an amplifier circuit with a gain of 1.

Accordingly, the potential V1 of the signal line Dm in FIG. 6 can be expressed as the following formula:

$$V1 = Vpd + a \tag{1},$$

where a represents an offset voltage that takes a value depending on the threshold voltage of the transistor TR1.

At a time T2, the driver circuit 14 changes the potential of the control line Rst to a high level. As a result, the transistor TRst becomes conductive to reset the charge of the feedback capacitor Cf in the integrator in the signal detector circuit 16 to 0. The potential V3 of the output Vout of the integrator at this time becomes the offset voltage of the operating amplifier circuit OPA. Accordingly, the two terminals of the capacitor Cdet are supplied with the potential V1 and the potential V3.

At a time T3, the driver circuit 14 returns the potential of the control line Rst to a low level. As a result, the transistor TRst becomes non-conductive. Accordingly, the sum of the charge stored at the terminal of the capacitor Cdet connected with the signal detector circuit 16 and the charge stored at the terminal of the feedback capacitor Cf connected with the capacitor Cdet is stored.

At a time T4, the driver circuit 14 changes the potential of the control line Rn to a high level. As a result, the transistor TR3 becomes conductive to reset the anode potential of the photodiode PD to the potential of the power line PB. Then, the potential V2 of the signal line Dm can be expressed as follows:

$$V2 = VB + a \tag{2},$$

where VB represents the potential of the power line PB.

Since the potential of the signal line Dm changes from V1 to V2, the charge Q expressed as the following formula is transferred to the signal detector circuit 16 via the capacitor Cdet:

$$Q = (V2 - V1) \times Cdet \tag{3}.$$

This transferred charge is stored to the feedback capacitor Cf and therefore, the output V4 of the integrator becomes as follows:

$$V4 = -Q/Cf + V3 \quad (4).$$

Further, the potential V4 can be rewritten as follows, in view of the relations of the formulae (1) to (3):

$$V4 = -Cdet/Cf \times (VB - Vpd) + V3 \quad (5).$$

This formula means that the differential voltage between the potential Vpd in accordance with the signal level and the known potential VB is amplified with the ratio of the capacitance of the capacitor Cdet to the capacitance of the capacitor Cf and output from the integrator. To be noted is that the offset voltage a that depends on the threshold voltage of the transistor TR1 of the pixel 13 is eliminated by taking the difference between the potentials V1 and V2. This means that the variation in offset voltage among the individual pixels 13, if any, does not cause variation in output among the integrators.

Subsequently, the driver circuit 14 changes the potential of the control line Rn to a low level at a time T5 and the potential of the control line Gn to a low level at a time T6 to complete the reading optical signals from one pixel row.

As described above, the signal voltage of a pixel 13 is amplified with a rate of Cdet/Cf in the image sensor of this disclosure. When the rates Cdet/Cf are not equal among the pixel columns, the amplification rate varies. To address this issue, the main control circuit 18 of the image sensor 10 of this disclosure measures the amplification rates of individual pixel columns.

Figure 7:
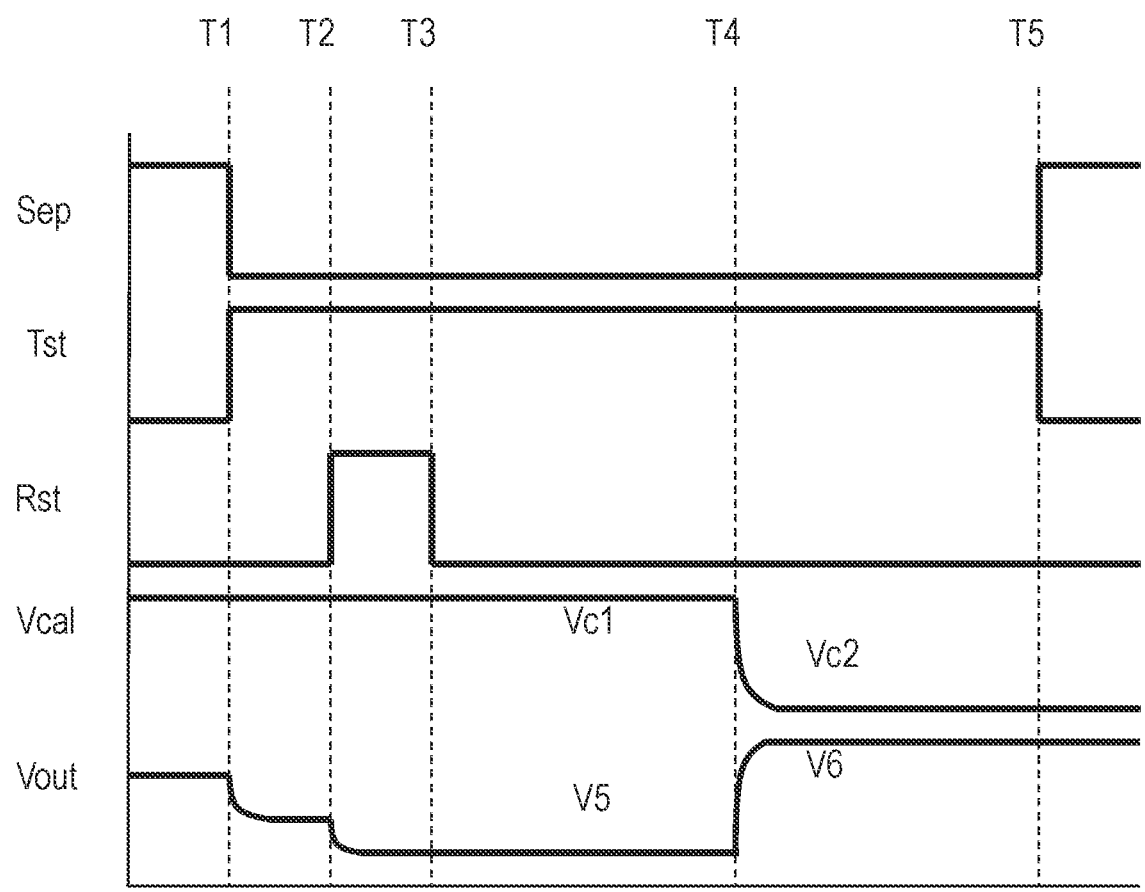
FIG. 7 is a timing chart illustrating the operation of the image sensor in the embodiment to measure the amplification rate for an output signal.

FIG. 7 is a timing chart illustrating the operation of the image sensor to measure the amplification rates of individual pixel columns. In response to an instruction from the main control circuit 18, the driver circuit 14 changes the signals as described as follows.

At a time T1, the driver circuit 14 changes the potential of the control line Sep to a low level and the potential of the control line Tst to a high level. As a result, the transistor TR7 becomes conductive and the transistor TR6 becomes non-conductive. By this time, the driver circuit 14 sets the potential Vcal of the power line Cal supplied from the pulsed power supply to a value Vc1 (first potential). As a result, the potential of the signal line Dm also becomes Vc1.

At a time T2, the driver circuit 14 changes the potential of the control line Rst to a high level. As a result, the transistor TRst becomes conductive to reset the charge of the feedback capacitor Cf to 0. At a time T3, the driver circuit 14 changes the potential of the control line Rst to a low level. As a result, the transistor TRst becomes non-conductive. The output V5 of the integrator in this state is the offset voltage of the operating amplifier circuit OPA.

At a time T4, the driver circuit 14 changes the potential Vcal of the power line Cal to a value Vc2 (second potential). As a result, the potential of the signal line Dm changes from Vc1 to Vc2 and therefore, the charge Q expressed by the following formula is transferred to the signal detector circuit 16 via the capacitor Cdet:

$$Q = (Vc2 - Vc1) \times Cdet \quad (6).$$

This transferred charge is stored to the feedback capacitor Cf and therefore, the output V6 of the integrator becomes as follows:

$$V6 = -Q/Cf + V5 \quad (7).$$

In view of the formula (6), the formula (7) can be rewritten as follows:

$$V6 - V5 = -Cdet/Cf \times (Vc2 - Vc1) \quad (8).$$

Since the potentials Vc1 and Vc2 are known, the main control circuit 18 can obtain the amplification rates of individual pixel columns by measuring V6 and V5 in all pixel columns. The main control circuit 18 calculates correction coefficients to equalize the amplification rates among all pixel columns from the acquired amplification rates and stores the calculated correction coefficients. When the image sensor 10 reads optical signals, the main control circuit 18 corrects the read signals with these correction coefficients. This operation eliminates the effect of the variation in the ratio of Cdet to Cf among the pixel columns from the optical signals.

At a time T5, the driver circuit 14 changes the potential of the control line Sep to a high level and the potential of the control line Tst to a low level to complete the measuring the amplification rates.

The main control circuit 18 can measure (calibrate) the amplification rates when the image sensor 10 starts operating or with predetermined intervals while the image sensor 10 is in operation. Alternatively, this measurement can be performed only at the shipment of the image sensor 10, if the characteristics of signal detector circuit 16 vary little.

Embodiment 2

Figure 8:
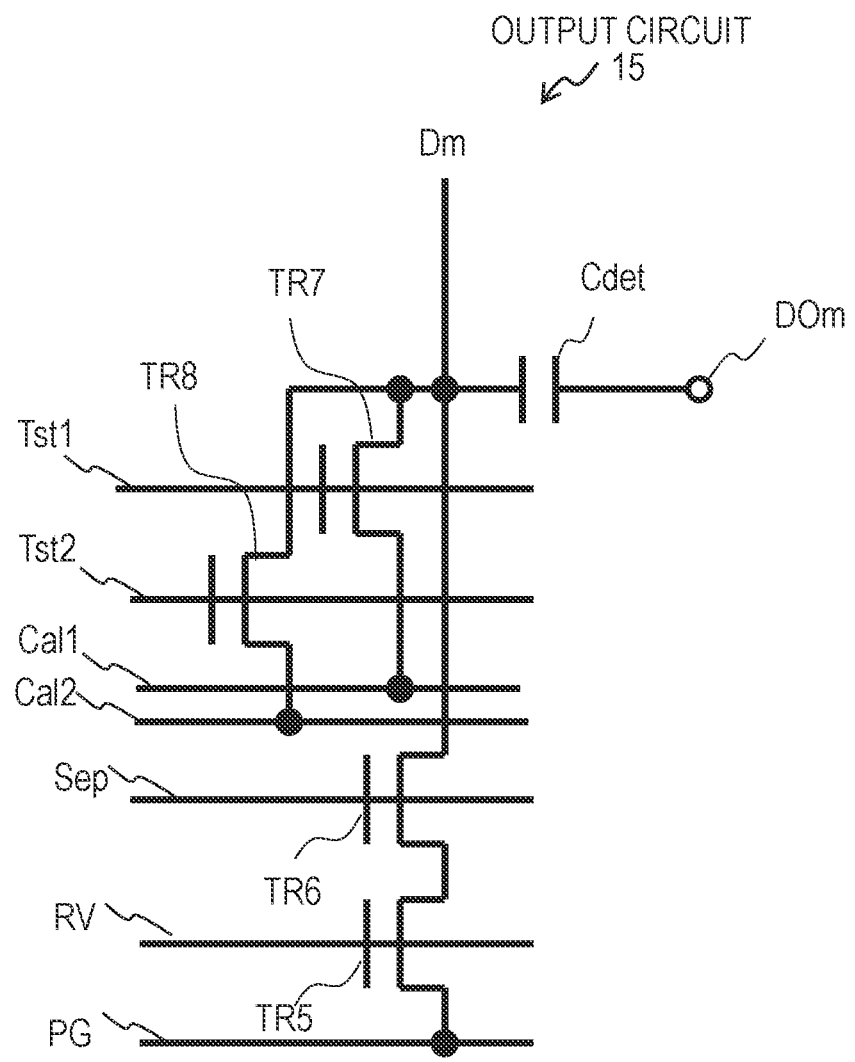
FIG. 8 is a circuit diagram illustrating a circuit configuration of an output circuit applicable to the image sensor in another embodiment.

FIG. 8 is a circuit diagram illustrating a circuit configuration of an output circuit in an image sensor related to Embodiment 2 of this disclosure. The output circuit 15 includes four transistors TRS, TR6, TR7, and TR8 and a capacitor Cdet for voltage-to-charge conversion. The gate terminal of the transistor TR5 is connected with a control potential line RV; the drain terminal of the transistor TR5 is connected with the source terminal of the transistor TR6; and the source terminal of the transistor TR5 is connected with a power line PG.

The gate terminal of the transistor TR6 is connected with a control line Sep and the drain terminal of the transistor TR6 is connected with a signal line Dm. The gate terminal of the transistor TR7 is connected with a control line Tst1; the drain terminal of the transistor TR7 is connected with the signal line Dm; and the source terminal of the transistor TR7 is connected with a power line Cal1 (first power line). The gate terminal of the transistor TR8 is connected with a control line Tst2; the drain terminal of the transistor TR8 is connected with the signal line Dm; and the source terminal of the transistor TR8 is connected with a power line Cal2 (second power line). The transistors TR7 and TR8 are switch circuits for controlling the connection (conduction) between the signal line Dm and the power line Cal1 and between the signal line Dm and the power line Cal2, respectively.

One terminal of the capacitor Cdet is connected with the signal line Dm and the other terminal of the capacitor Cdet is connected with the signal detector circuit 16. The transistor TR5 has a function of a constant current supply that makes the current flowing between the source and the drain constant using the potential of the control potential line RV. The output circuit 15 has an output terminal DOm.

Figure 9:
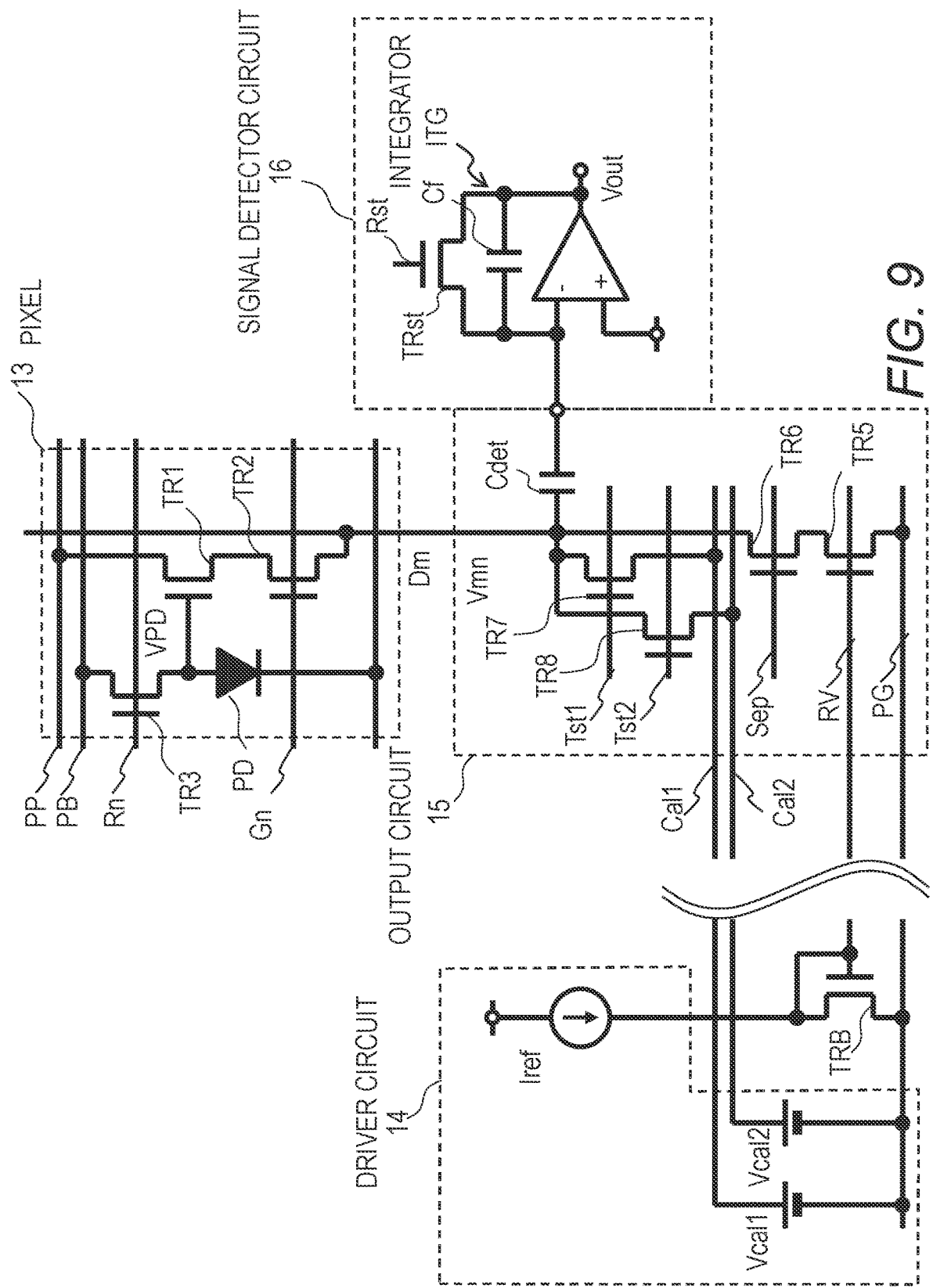
FIG. 9 is a circuit diagram illustrating a part of the connections among the components included in the image sensor in the other embodiment.

FIG. 9 illustrates a part of the connections among the components included in the image sensor 10 in Embodiment 2 of this disclosure. FIG. 9 illustrates only one pixel 13 in the pixel region 12 and only a part of the driver circuit 14 involved in controlling an output circuit 15. The driver circuit 14 includes a power supply circuit including two direct-current sources. Like in Embodiment 1, the transistor TRB and the transistor TR5 work as a current mirror circuit. The following description is provided assuming that the current ratio in current mirroring is 1.

Figure 10:
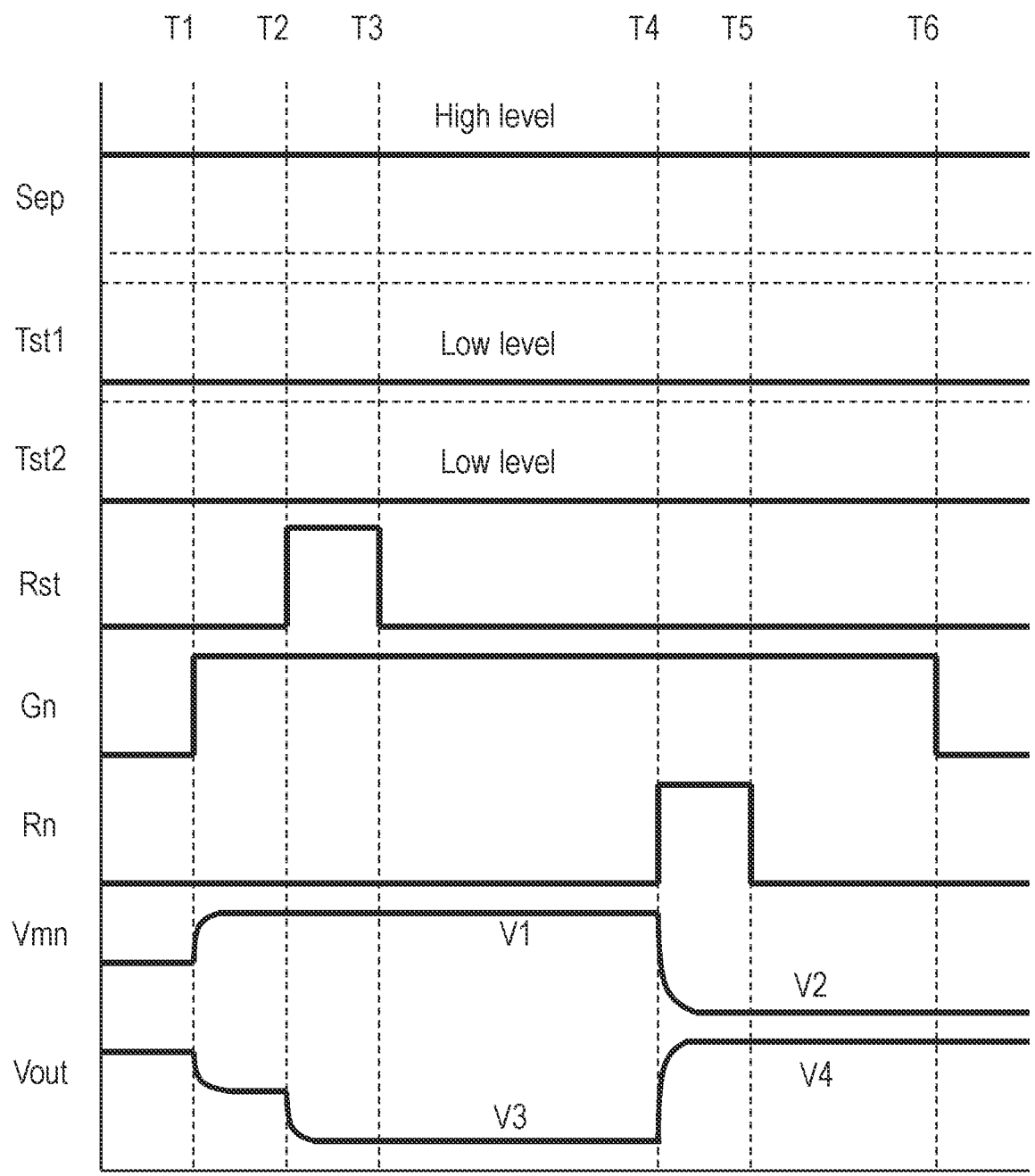
FIG. 10 is a timing chart illustrating the operation of the image sensor in the other embodiment to read an optical signal.

FIG. 10 is a timing chart illustrating the operation of the image sensor 10 in Embodiment 2 of this disclosure to read an optical signal. Except that the transistors TR7 and TR8 are both non-conductive because the potentials of the control lines Tst1 and Tst2 are at a low level, the operation of the image sensor 10 in Embodiment 2 is the same as the operation of the image sensor in Embodiment 1.

Figure 11:
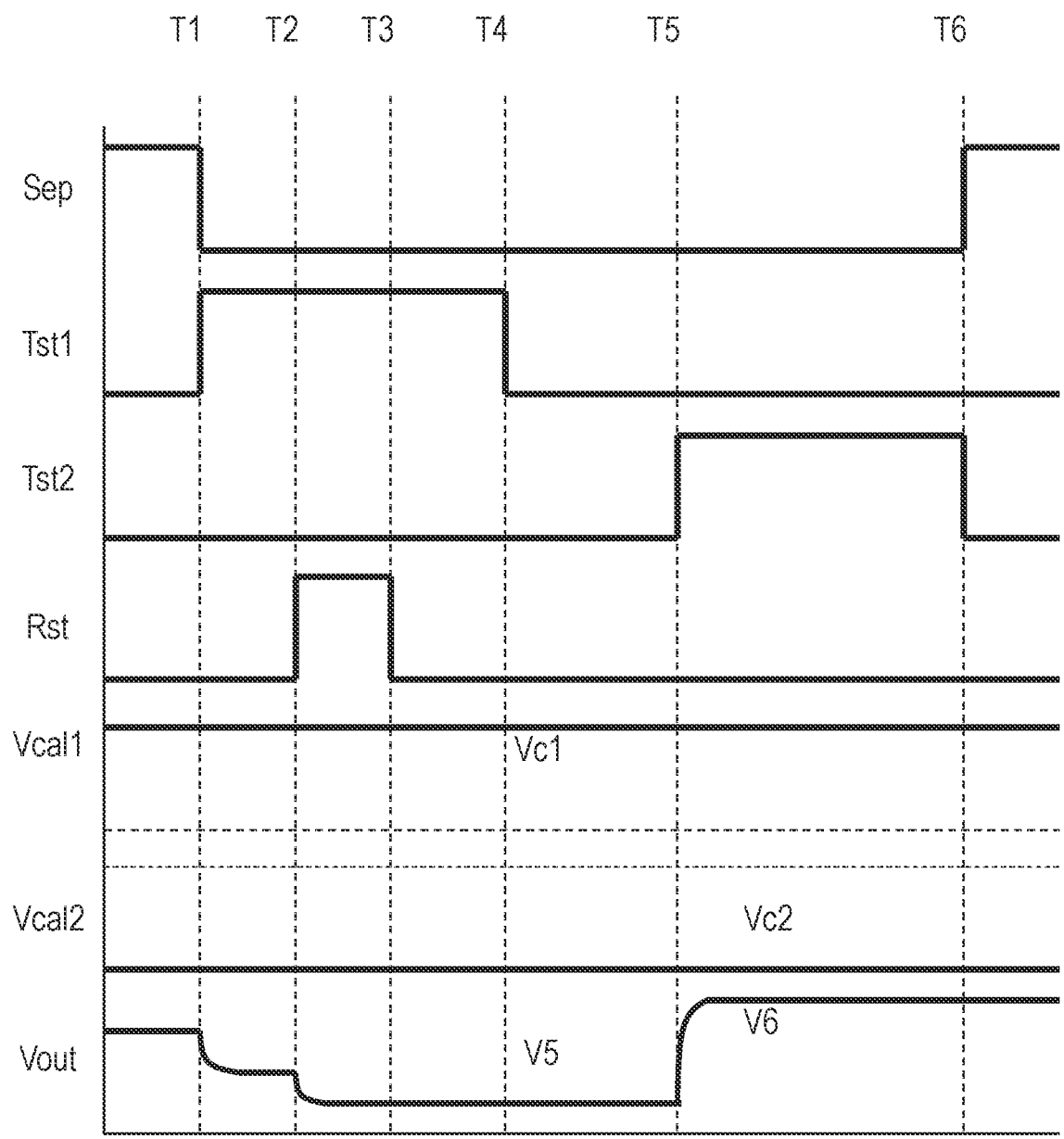
FIG. 11 is a timing chart illustrating the operation of the image sensor in the other embodiment to measure the amplification rate for an output signal.

FIG. 11 is a timing chart illustrating the operation of the image sensor in Embodiment 2 of this disclosure to measure the amplification rates of individual pixel columns. The driver circuit 14 in Embodiment 2 keeps the potential Vc1 (first potential) of the power line Cal1 and the potential Vc2 (second potential) of the power line Cal2 constant. The potentials Vc1 and Vc2 are different potentials and they are supplied from different direct-current sources.

At a time T1, the driver circuit 14 changes the potential of the control line Sep to a low level and the potential of the control line Tst 1 to a high level. As a result, the transistor TR7 becomes conductive and the transistor TR6 becomes non-conductive. Since the potential of the control line Tst2 is a low level at this time, the transistor TR8 are non-conductive. Then, the potential of the signal line Dm becomes Vc1.

At a time T2, the driver circuit 14 changes the potential of the control line Rst to a high level.

As a result, the transistor TRst becomes conductive to reset the charge of the feedback capacitor Cf to 0. At a time T3, the driver circuit 14 changes the potential of the control line Rst to a low level. As a result, the transistor TRst becomes non-conductive. The output V5 of the integrator in this state is the offset voltage of the operating amplifier circuit OPA.

At a time T4, the driver circuit 14 changes the potential of the control line Tst1 to a low level. As a result, the transistor TR7 becomes non-conductive. At a time T5, the driver circuit 14 changes the potential of the control line Tst2 to a high level. As a result, the transistor TR8 becomes conductive and the potential of the signal line Dm changes to Vc2. Since the potential of the signal line Dm changes from Vc1 to Vc2, the charge Q expressed by the following formula is transferred to the signal detector circuit 16 via the capacitor Cdet:

$$Q=(Vc2-Vc1)\times Cdet \quad (9).$$

This transferred charge is stored to the feedback capacitor Cf and accordingly, the output V6 of the integrator is expressed as follows:

$$V6=-Q/Cf+V5 \quad (10).$$

In view of the formula (9), the formula (10) can be rewritten as follows:

$$V6-V5=-Cdet/Cf\times(Vc2-Vc1) \quad (11).$$

Since the potentials Vc1 and Vc2 in the formula (11) are known, the main control circuit 18 can obtain the amplification rates of individual pixel columns by measuring V6 and V5 of all pixel columns. That is to say, the image sensor in Embodiment 2 of this disclosure can measure the amplification rates of all pixel columns, which are required to correct the amplification rates, without a power supply or a circuit that changes the voltage in the driver circuit 14.

In the image sensor in Embodiment 1, a large number of signal lines are connected with a power line Cal and therefore, the capacitance of the power line Cal becomes large in measurement of the amplification rates. To change the potential of a power line having a large capacitance, a power supply or a circuit having a very small output resistance is required. Accordingly, a large-scale or expensive driver circuit 14 could be necessary or alternatively, the measurement of amplification rates could take a long time.

The image sensor in Embodiment 2 does not need to change the potentials of the power lines Cal1 and Cal2 and therefore, simple power supply circuits are applicable even if the power lines Cal1 and Cal2 have large capacitances. In addition, the time to measure the amplification rates can be reduced by connecting a capacitor having a capacitance considerably larger than the capacitances of the power lines Cal1 and Cal2 in parallel to the power supply circuit.

Embodiment 3

When a transistor, especially a TFT, is used for an amplifier circuit, its characteristics could vary. In an example where the amplifier circuit is configured as a source follower circuit and includes a transistor having an n-type of conductivity, the gate of the transistor keeps receiving a higher voltage than the source. In the case where a TFT is used as the transistor, the threshold voltage of the TFT varies when its gate keeps receiving a voltage inducing charge in the channel. The image sensor in Embodiment 3 of this disclosure provides a driving method to reduce the variation in threshold voltage of this TFT.

Either the image sensor in Embodiment 1 or the image sensor in Embodiment 2 is applicable to the image sensor in Embodiment 3. The following description is provided using an image sensor having the configuration in Embodiment 1 and including a transistor having an n-type of conductivity.

Figure 12:
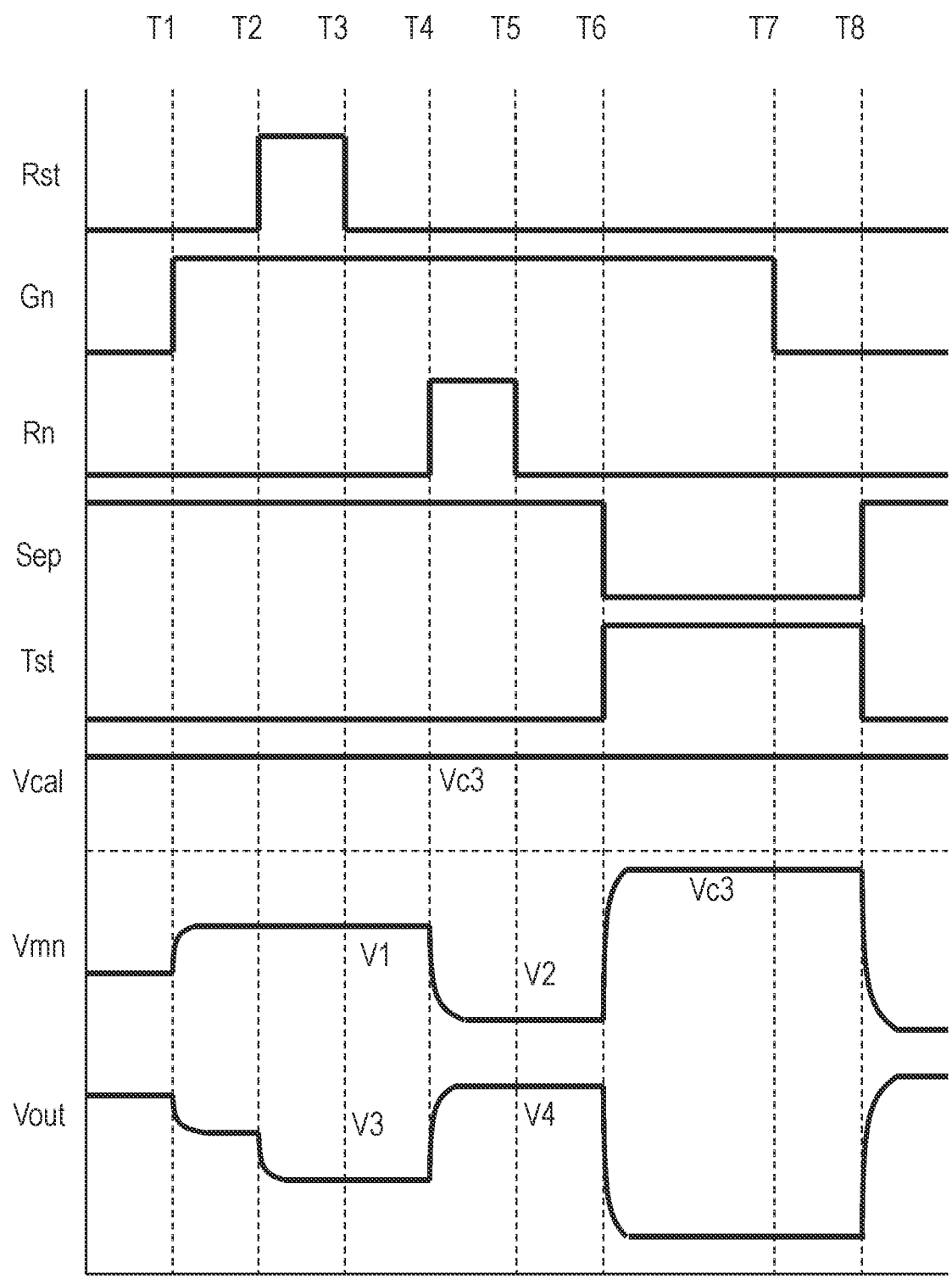
FIG. 12 is a timing chart illustrating the operation of the image sensor in still another embodiment to read an optical signal.

FIG. 12 is a timing chart illustrating the operation of the image sensor to read an optical signal. During this operation, the driver circuit 14 keeps the potential Vcal of the power line Cal at Vc3 all the time.

At a time T1, the driver circuit 14 changes the potential of the control line Gn to a high level to make the transistor TR2 conductive. Like the operation of the image sensor in Embodiment 1 to read an optical signal, a potential in accordance with the potential Vpd of the anode terminal of the photodiode PD is output to the signal line Dm.

At a time T2, the driver circuit 14 changes the potential of the control line Rst to a high level to make the transistor TRst conductive and reset the charge of the feedback capacitor Cf. At a time T3, the driver circuit 14 returns the potential of the control line Rst to a low level to make the transistor TRst non-conductive.

At a time T4, the driver circuit 14 changes the potential of the control line Rn to a high level to make the transistor TR3 conductive and reset the photodiode PD. As a result, the potential of the signal line changes from V1 to V2 in accordance with the potential of the power line PB. The charge in accordance with the variation in the potential is transferred to the integrator via the capacitor Cdet to change the output of the integrator. As already described, the change in output of the integrator to be detected is the variation in the potential caused by the optical signal which is amplified with an amplification rate in proportion to the capacitance ratio Cdet/Cf.

Subsequently at a time T5, the driver circuit 14 changes the potential of the control line Rn to a low level to make the transistor TR3 non-conductive. At a time T6, the driver circuit 14 changes the potential of the control line Sep to a low level and the potential of the control line Tst to a high level to make the transistor TR6 non-conductive and the transistor TR7 conductive.

At this time, the potential of the power line Cal is Vc3 and the transistor TR2 is conductive because the control line Gn is kept at the high level. Accordingly, the potential of the source of the transistor TR1 becomes Vc3 (third potential). In an example, this potential Vc3 is set to a value higher than the potential of the anode electrode of the photodiode PD being irradiated with light in the saturated exposure amount. Then, the gate potential of the transistor TR1 becomes lower than the source potential and as a result, the polarity of the gate-source voltage is inverted from the polarity when the transistor TR1 amplifies the output of the photodiode PD.

At a time T7, the driver circuit 14 changes the potential of the control line Gn to a low level to make the transistor TR2 non-conductive. The source potential of the transistor TR1 is maintained at the potential Vc3. Accordingly, the gate of the transistor TR1 keeps receiving a lower potential than the source, namely a negative potential, until the next operation to read an optical signal. This configuration of applying a voltage having the opposite polarity to the polarity of the gate-source voltage in amplification operation reduces the threshold variation of the transistor TR1.

Although the foregoing description is provided assuming that the transistors have n-type of conductivity, the same effects are attained with transistors having p-type of conductivity. However, it is necessary to change the polarity of the voltage to be applied to the transistors. Meanwhile, the circuit configurations illustrated in FIGS. 13 and 14 are also applicable to the pixels 13 of the image sensor of this disclosure.

Figure 13:
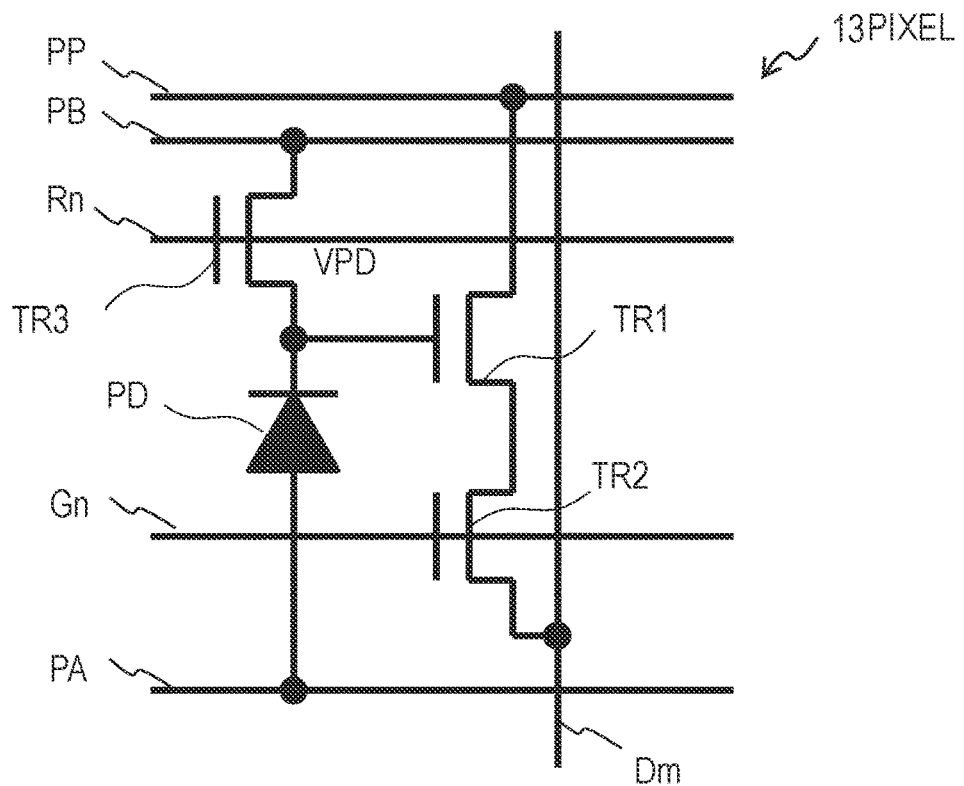
FIG. 13 is a circuit diagram illustrating a circuit configuration applicable to a pixel in an image sensor in the embodiments.
Figure 14:
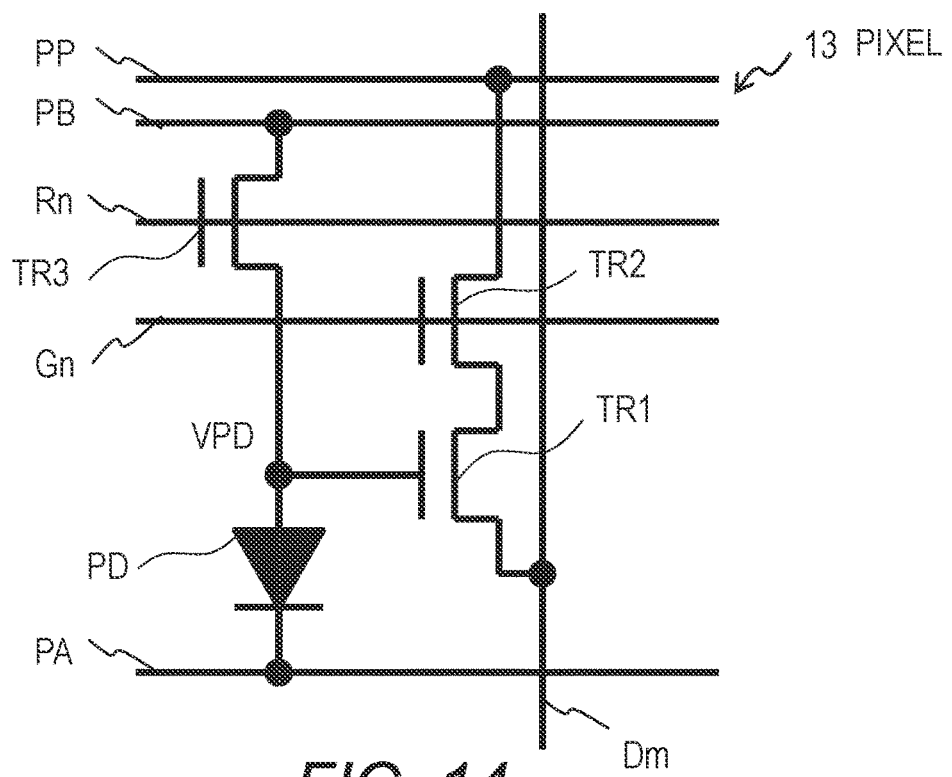
FIG. 14 is a circuit diagram illustrating a circuit configuration applicable to a pixel in an image sensor in the embodiments.

In the circuit configuration in FIG. 13, the photodiode PD is oriented opposite to the photodiode in the circuit configuration illustrated in FIG. 2; the potential of the cathode terminal of the photodiode PD is detected. In the circuit configuration in FIG. 14, the transistor TR2 is disposed between the power line PP and the transistor TR1. Specifically, the source of the transistor TR2 is connected with the drain of the transistor TR1 and the drain of the transistor TR2 is connected with the power line PP. Note that the circuit configuration in FIG. 14 is difficult to reduce the variation in characteristics of the transistor TR1 functioning as an amplifier circuit of the pixel 13.

As described above, the image sensor of this disclosure maintains high SNR even if the image sensor has higher resolution, or smaller pixels. Further, the image sensor of this disclosure reduces the variation in offset among optical signals caused by the variation in threshold voltage among the transistors functioning as amplifier circuits in the pixels. In addition, the image sensor of this disclosure measures the amplification rates of the signal detector circuits each provided for a pixel column so as to uniformize the amplification rates. Further, the image sensor of this disclosure can operate to reduce the variation in characteristics of the transistor functioning as an amplifier circuit in a pixel.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An image sensor comprising:
   a pixel;
   a signal line configured to transmit an optical signal of the pixel; and
   a control circuit configured to control the pixel to detect the optical signal transmitted by the signal line,
   wherein the pixel includes:
      a photodetector;
      an amplifier circuit configured to amplify an optical signal from the photodetector; and
      a first switch configured to control whether to output the optical signal from the pixel to the signal line,
   wherein the control circuit includes:
      a first capacitor connected with the signal line;
      an integrator connected with the signal line via the first capacitor in order to detect the optical signal, and
   wherein the control circuit is configured to:
      successively supply a first potential and a second potential different from each other to the signal line in a state where the first switch is non-conductive; and
      measure an amplification rate determined by the first capacitor and the integrator based on outputs of the integrator when the first potential is supplied and the second potential is supplied.

2. The image sensor according to claim 1,
   wherein the pixel, the signal line, and the first capacitor are fabricated on an insulator substrate, and
   wherein the integrator is fabricated on a silicon substrate.

3. The image sensor according to claim 1, comprising:
   a plurality of pixels including the pixel;
   a plurality of signal lines including the signal line, being configured to transmit optical signals of the plurality of pixels;
   a plurality of first capacitors including the first capacitor, each of the plurality of first capacitors being connected with one of the plurality of signal lines; and
   a plurality of integrators including the integrator, each of the plurality of integrators being connected with one of the plurality of signal lines via one of the plurality of first capacitors,
   wherein each of the plurality of pixels includes:
      a photodetector;
      an amplifier circuit configured to amplify an optical signal from the photodetector; and
      a first switch configured to control whether to output the optical signal from the pixel to the signal line, and
   wherein the control circuit is configured to:
      successively supply the first potential and the second potential to the plurality of signal lines in a state where the first switches of the plurality of pixels are non-conductive; and
      measure an amplification rate determined by a first capacitor and an integrator based on outputs of the integrator when the first potential is supplied and the second potential is supplied, for each pair of a first capacitor and an integrator.

4. The image sensor according to claim 1,
   wherein the control circuit includes:
      a power supply circuit configured to supply the first potential and the second potential; and
      a switch circuit configured to control conductivity between the power supply circuit and the signal line, and
   wherein the control circuit is configured to:
      maintain the switch circuit in a non-conductive state when detecting the optical signal; and
      maintain the switch circuit in a conductive state when supplying the first potential and the second potential to the signal line.

5. The image sensor according to claim 4,
wherein the power supply circuit includes a pulsed power supply configured to generate the first potential and the second potential, and
wherein the switch circuit includes a second switch configured to control conductivity between the pulsed power supply and the signal line.

6. The image sensor according to claim 4, further comprising:
a first power line to be maintained at the first potential; and
a second power line to be maintained at the second potential,
wherein the switch circuit includes:
a third switch configured to control connection between the first power line and the signal line; and
a fourth switch configured to control connection between the second power line and the signal line.

7. The image sensor according to claim 4,
wherein the amplifier circuit includes an amplifier transistor configured to amplify an optical signal from the photodetector, and
wherein the control circuit is configured to supply a third potential that inverts the polarity of the voltage applied across a control terminal of the amplifier transistor and the signal line when the amplifier transistor amplifies the optical signal to the amplifier transistor from the power supply circuit via the switch circuit and the signal line after detecting the optical signal of the pixel.

8. The image sensor according to claim 7,
wherein the first switch is located between the amplifier transistor and the signal line, and
wherein the control circuit is configured to:
maintain the first switch in a conductive state when supplying the third potential to the amplifier transistor from the power supply circuit via the switch circuit and the signal line; and
change the first switch to a non-conductive state after supplying the third potential.

9. A method of controlling an image sensor including a pixel, a signal line configured to transmit an optical signal of the pixel, a first capacitor connected with the signal line, and an integrator connected with the signal line via the first capacitor in order to detect the optical signal,
the pixel including a photodetector, an amplifier circuit configured to amplify an optical signal from the photodetector, and a first switch configured to control whether to output the optical signal from the pixel to the signal line, and
the method comprising:
successively supplying a first potential and a second potential different from each other to the signal line in a state where the first switch is non-conductive; and
measuring an amplification rate determined by the first capacitor and the integrator based on outputs of the integrator when the first potential is supplied and the second potential is supplied.

* * * * *